(12) United States Patent
White et al.

(10) Patent No.: US 10,543,516 B2
(45) Date of Patent: *Jan. 28, 2020

(54) LIQUID-IMPREGNATED COATINGS AND DEVICES CONTAINING THE SAME

(71) Applicant: GVD Corporation, Cambridge, MA (US)

(72) Inventors: Aleksandr J. White, Arlington, MA (US); William Shannan O'Shaughnessy, Cambridge, MA (US); Seth Johnson, Watertown, MA (US); Karen K. Gleason, Cambridge, MA (US)

(73) Assignee: GVD Corporation, Cambridge, MA (US)

( * ) Notice: Subject to any disclaimer, the term of this patent is extended or adjusted under 35 U.S.C. 154(b) by 724 days.

This patent is subject to a terminal disclaimer.

(21) Appl. No.: 14/787,544

(22) PCT Filed: Apr. 29, 2014

(86) PCT No.: PCT/US2014/035830
§ 371 (c)(1),
(2) Date: Oct. 28, 2015

(87) PCT Pub. No.: WO2014/179283
PCT Pub. Date: Nov. 6, 2014

(65) Prior Publication Data
US 2016/0074915 A1    Mar. 17, 2016

Related U.S. Application Data

(60) Provisional application No. 61/817,173, filed on Apr. 29, 2013.

(51) Int. Cl.
| | | |
|---|---|---|
| *C23C 16/50* | (2006.01) | |
| *B08B 17/06* | (2006.01) | |
| *B05D 3/06* | (2006.01) | |
| *C23C 16/02* | (2006.01) | |

(52) U.S. Cl.
CPC .............. *B08B 17/065* (2013.01); *B05D 3/06* (2013.01); *C23C 16/02* (2013.01); *C23C 16/50* (2013.01)

(58) Field of Classification Search
CPC .................................. C23C 16/02; C23C 16/50
See application file for complete search history.

(56) References Cited

U.S. PATENT DOCUMENTS

| | | | |
|---|---|---|---|
| 7,791,815 B2 | 9/2010 | Weikart | |
| 9,714,463 B2* | 7/2017 | White | B05D 1/60 |
| 2006/0040053 A1* | 2/2006 | Gleason | B01D 19/0031 |
| | | | 427/248.1 |
| 2007/0177276 A1* | 8/2007 | Liogier D'ardhuy | G02B 3/14 |
| | | | 359/666 |
| 2009/0117268 A1* | 5/2009 | Lewis | B05D 1/60 |
| | | | 427/205 |
| 2012/0003497 A1* | 1/2012 | Handy | B05D 1/34 |
| | | | 428/615 |
| 2012/0276334 A1* | 11/2012 | Fedynyshyn | B05D 5/04 |
| | | | 428/141 |
| 2013/0171546 A1* | 7/2013 | White | B05D 1/60 |
| | | | 429/508 |

FOREIGN PATENT DOCUMENTS

| | | |
|---|---|---|
| EP | 2143818 | 1/2010 |
| WO | 2003038143 | 5/2003 |
| WO | 2012100099 | 7/2012 |
| WO | 2012100100 | 7/2012 |
| WO | 2013102011 | 7/2013 |

OTHER PUBLICATIONS

Wong et al; Bioinspired self-repairing slippery surfaces with pressure-stable omniphobicity; Nature; vol. 477; Sep. 22, 2011; pp. 443-447. (Year: 2011).*
Anand, "Enhanced condensation on lubricant-impregnated nanotextured surfaces", ACS Nano, 6(11):20122-9 (2012).
Bayiati, et al., "Selective plasma-induced deposition of fluorocarbon films on metal surfaces for actuation in microfluidics", J Vac. Sci. Technol., 22(4):1546-51 (2004).
Blickenstraff, et al., "Techniques for shadow mask deposition of non-planar dielectric layers", Lasers Electro-Optics Soc., 16th annual meeting of the IEEE 700-01, Oct. 27-28, 2003.
Chang, et al., "An electrowetting-based microfluidic platform for magnetic bioasssays", 14th Intl Conf Miniaturized Sys Chem. and Life Sci., pp. 1331-1333 (Oct. 2010).
Dhindsa, et al., "Reliable and low-voltage electrowetting on thin parylene films", Thin Solid Films, 519(10):3346-51(2011).
Fan, et al., "Electrowetting on polymer dispersed liquid crystal", App Physics Ltrs., 96:164109 (2009).
Foumond, et al., "Impact of ammonia pretreatment of the silicon surface prior to the deposition of silicon nitride layer by PECVD", 23rd European Photovoltaic Solar Energy Conference and Exhibition, (Sep. 2008).
Gleason, et al., "Polymer nanocoatings by initiated chrmical vapor deposition (CVD)", NSTI-Nanotch., 2:310-2 (2005).
Heikenfeld, et al., "Review Paper: a critical review of the present and future prospects for electronic paper", J of the SID, 19(2):129-56 (2011).
Kahouli, et al., "Structural and dielectric study of parylene C thin films", J. Legrand Appl. Phys. Lett., 94:152901-3 (2009).

(Continued)

*Primary Examiner* — Elizabeth A Burkhart
(74) *Attorney, Agent, or Firm* — Pabst Patent Group LLP

(57) ABSTRACT

Liquid-impregnated textured coatings containing one or more materials on a variety of surfaces are described herein. The coatings can be prepared by chemical vapor deposition techniques or other techniques known in the art. The texture can be random, fractal, or patterned. The texture can be pores, cavities, and/or micro- and/or nanoscale features/structures. The capillary forces arising from the nano- or microscopic texture of the coating stabilizes the liquid within the textured features and at the surface of the coating resulting in non-wetting properties for a variety of surfaces. They coatings may be formed in a single layer or as multiple layers. In order to maximize ease of deposition and processing, the coating may be formed of graded composition to optimize both bulk and surface properties without the need for multiple coatings.

33 Claims, No Drawings

(56) References Cited

OTHER PUBLICATIONS

Kim, et al., "Liquid-infused nanostructured surfaces with extreme anti-ice and anti-frost performance", ACS Nano, 6(8):6569-77 (2012).

Mao, et al., "Hot filament chemical vapor deposition of poly(glycidyl methacrylate) thin films using tert-Butyl peroxide as an initiator", Langmuir, 20:2484-8 (2004).

Mugele and Baret, "Electrowetting: from basics to applications", J. of Phys. Cond. Matter, 17:R705-R774 (2005a).

Mugele, et al., "Electrowetting: A convenient way to switchable wettability patterns", J. Phys. Cond. Matt., 17:S559 (2005b).

Narrainen, et al., "Novel multi end-functionalized polymers. Additives to modify properties at surfaces and interfaces", Soft Matter, 2:126-8 (2006).

Raj, et al., "Ion and Liquid Dependent Dielectric Failure in Electrowetting Systems", Langmuir, 25(20): 12387-92 (2009).

Smith, et al., "Droplet mobility on lubricant-impregnated surfaces", Soft Matter, 9:1772-80 (2013).

Van Aken, et al., "Inline processed flexible thin film silicon solar cells using linear PECVD sources" 25th European Photovoltaic Solar Energy Conf and Exhib, 5th World Conf on Photovoltaic Energy Conven., (Sep. 2010).

Wong, et al., "Bioinspired self-repairing slippery surfaces with pressure-stable omniphobicity", Naure,477:433-47 (2011).

Zdyrko, et al., "Universal plarform for surface modification employing grafted layers", Material Matters, 44:1-7 (2008).

Zhou, et al., "A full description of a simple and scalable fabrication process for electrowetting display", J. Micromech. Microeng., 19(065029):1-12 (2009).

International Search Report and Written Opinion for PCT Application PCT/US2012/071959 dated Sep. 6, 2013.

International Search Report and Written Opinion for PCT Application PCT/US2014/035830 dated Sep. 2, 2015.

* cited by examiner

LIQUID-IMPREGNATED COATINGS AND DEVICES CONTAINING THE SAME

CROSS-REFERENCE TO RELATED APPLICATIONS

This application is a 371 application of International Application No. PCT/US2014/035830, filed Apr. 29, 2014, which claims priority to and benefit of U.S. Provisional Application No. 61/817,173, filed Apr. 29, 2013, the disclosures of which are incorporated herein in their entirety by reference.

FIELD OF THE INVENTION

This invention is in the field of coatings, particularly liquid-impregnated textured coatings.

BACKGROUND OF THE INVENTION

Many current synthetic liquid-repellent surfaces are based on the lotus effect: water droplets are supported by microscopic surface textures on a composite solid-air interface that enables them to roll off easily. The microscopic roughness is combined with low surface energy to attain extreme non-wetting properties. Liquid droplets are supported atop texture features with air pockets trapped within the texture. As long as the air pockets are stable, the surface continues to exhibit non-wetting behavior. Such surfaces are commonly classified as superhydrophobic, oleophobic, or omniphobic.

The lotus effect, however, does have some significant challenges. For instance, air pockets within the surface texture can be collapsed by external wetting pressures, can diffuse away into the surrounding liquid, and/or can lose robustness upon damage to the texture. Under condensation, such surfaces display poor drop mobility due to nucleation of droplets within texture features that pin to the surface. The high surface area of microtextures creates more nucleation sites to condense droplets and can induce ice nucleation at an even faster rate than smooth surfaces of the equivalent materials at high humidity conditions. Frost and ice that builds up within the textured features of such surfaces makes ice adhesion significantly stronger than that of smooth surfaces and substantially increasing the amount of energy required to remove the accumulated ice.

Slippery, non-wetting surfaces have been prepared by infusing a lubricating liquid within a microstructured substrate to produce a thin, ultrasmooth lubricating layer that can repel most immiscible materials. Micro-texturing can be introduced by a variety of methods including lithographic patterning of silicon microposts and micromolding of epoxy-based nanostructures from a silicon master. In these cases, the textured material is treated with a low surface energy silane to render the surface compatible with the low surface energy lubricating liquid. This is typically accomplished by placing the substrate in a desiccator under vacuum for at least a few hours. The textured and treated surface is subsequently infused with the lubricating oil applying it in several droplets. These fabrication approaches, however, are multiple step processes and are time and labor intensive. Further, lithographic patterning and micromolding are challenging to carry-out on non-planar surfaces and are not well-suited for some substrate materials, including metals Alternative approaches include electrodeposition of a conductive polymer on aluminum. The resulting polymer has a roughened texture that is capable of trapping the lubricating liquid. This approach, however, requires surface functionalization with a low surface energy silane to achieve chemical affinity with the lubricating oil. A major drawback of this approach is that it is limited to conductive substrates.

Another approach involves the use a textured membrane, such as a porous Teflon-based membrane. In this case, the Teflon-based membrane material already exhibits a chemical affinity with the lubricating oil and the silanization step is unnecessary. A product or structure requiring non-wetting properties, however, must have the membrane affixed to it. A significant drawback of this approach is the challenge in applying the membrane to non-planar surfaces with complex geometries.

There is a need for robust non-wetting surfaces that afford one or more of the following features: repellency to a variety of liquids, enhanced liquid condensation, resistance to ice formation, resistance to fogging, reduced drag in liquids, resistance to gas hydrate adhesion, provide antifouling properties, inhibition of corrosion, provide semi-permanent lubrication, present self-cleaning properties, and/or prevent microbial colonization which can be prepared without the limitations described above.

Therefore, it is an object of the invention to provide robust non-wetting surfaces that afford one or more of the following features: repellency to a variety of liquids, enhanced liquid condensation, resistance to ice formation, resistance to fogging, reduced drag in liquids, resistance to gas hydrate adhesion, provide antifouling properties, inhibition of corrosion, provide semi-permanent lubrication, present self-cleaning properties, and/or prevent microbial colonization which can be prepared without the limitations described above.

SUMMARY OF THE INVENTION

Liquid-impregnated textured coatings containing one or more materials on a variety of surfaces are described herein. The coatings can be prepared by chemical vapor deposition techniques or other techniques known in the art. The texture can be random, fractal, or patterned. The texture can be pores, cavities, and/or micro- and/or nanoscale features/structures. The dimensions of the texture can be less than 500 microns, 400 microns, 300 microns, 200 microns, 100 microns, 75 microns, 50 microns, 25 microns, 20 microns, 15 microns, 10 microns, 5 microns, 4 microns, 3 microns, 2 microns, 1 micron, 0.5 microns, 0.1 microns, 0.05 microns, or 0.01 microns. A liquid is subsequently infused into the textured features of the coating. The capillary forces arising from the nano- or microscopic texture of the coating stabilizes the liquid within the textured features and at the surface of the coating resulting non-wetting properties for a variety of surfaces.

In one embodiment, the devices or assemblies are coated with a vapor deposited materials including non-polymeric materials (e.g., metals, metal oxides, ceramics, silanes), polymeric materials, or combinations thereof. In a further embodiment, the vapor deposited coatings are formed by a CVD technique. They may be formed in a single layer or as multiple layers.

In order to maximize ease of deposition and processing, the coating may be formed of graded composition to optimize both bulk and surface properties without the need for multiple coatings. This may be achieved by varying the composition of feed gas to a pyrolytic CVD reactor throughout deposition.

The flexibility of CVD provides for the use of a wide range of materials in these applications. Possible coating materials for use include, but are not limited to, vinyl siloxanes, PTFE, fluorinated acrylates and methacrylates, divinylsiloxane-bis-benzocyclobutene (DVS-BCB), divinyl benzene, fluoropolymers such as ethylene tetrafluoroethylene (ETFE), fluorinated ethylene propylene, a copolymer of hexafluoropropylene and tetrafluoroethylene (FEP), perfluoroalkoxy vinyl ether (PFA), perfluordecanoic acid (PFDA), and Teflon AF, ceramics including $SiO_2$, and parylenes.

Such surfaces would be beneficial for a wide variety of applications. For example, repellency to liquids ranging from water, acids and bases, oil, blood, and fuel, would benefit areas ranging from architecture and biomedical devices to transportation. Surfaces offering enhanced condensation would be useful in industrial processes such as power generation, desalination, water harvesting, air conditioning, thermal management, and transportation. Ice-phobic coatings would present economic and safety benefits for many infrastructures such as power lines, aircraft, wind turbines, marine vessels, and telecommunications equipment, as well as in commercial refrigerators and freezers. Semi-permanent lubrication could be used in devices from machine parts and engines to medical device assemblies.

DETAILED DESCRIPTION OF THE INVENTION

I. Definitions

"Electrical bias", as used herein, refers to an electrical potential difference created between the liquid on top of the coating and the substrate beneath the coating. The electrical potential can be used to alter the contact angle of a hydrophilic fluid on the coating surface.

"Energy Source", as used herein, refers to the method of energy input into a gaseous system capable of activating one or more precursor gas species so as to render them capable of forming a coating on the deposition substrate. Example energy sources include, but are not limited to, heated filaments, ionic plasma excitation, gamma irradiation, ultraviolet irradiation, infrared irradiation, and electron beam excitation.

"Filament", as used herein, refers to resistively heated lengths of material capable of one or more of the following: thermal excitation of precursor gases, evaporative transfer of metal to the deposition substrate, or convective or radiative heating of the substrate.

"Gradient polymer coating", as used herein, refers to deposited coating(s) in which one or more physical, chemical, or mechanical properties vary over the deposition thickness. Variation may be continuous or step-wise without limit to the number of steps or changes in different properties.

"Inert Gas", as used herein, refers to a gas or gases which are not reactive under reaction conditions within the vacuum chamber.

"Vapor-phase coating system", as used herein, refers to any system utilized to deposit a dry coating on a substrate without need for subsequent solvent evaporation or thermal curing. Examples include, but are not limited to, chemical vapor deposition (including atmospheric CVD), atomic layer deposition, and physical vapor deposition.

"Water contact angle", as used herein, refers to the angle of incidence of a water droplet in air on the surface of a material. In one embodiment, the water contact angle is measured by a goniometer using the sessile drop technique.

In another embodiment, the "receding water contact angle" is measured as the volume of a water droplet on a surface decreases with time.

"Conductive polymer" as used herein can refer to polymers which are intrinsically electrically-conductive, and which do not require incorporation of electrically-conductive additives (e.g., carbon black, carbon nanotubes, metal flake, etc.) to support substantial conductivity of electronic charge carriers. Charge carriers believed to be responsible for electrical conductivity in conductive polymers include polarons, bipolarons, and solitons. It may also refer to a conjugated polymer system which, if properly doped, would be conductive regardless of current doping state.

"Gaseous polymerizable species", as used herein, refers to species which can be generated in the gas phase and upon polymerization form a conducting polymer. The term "gaseous polymerizable species" includes monomers, oligomers, and metal-organic compounds. The gaseous polymerizable species disclosed herein may not necessarily be gases at room temperature and atmospheric pressure. If such species are liquids or solids, for example, they may be evaporated at reduced pressure or heated or both in order to perform the methods described herein.

"Oligomer" as used herein may refer to structures having more than one fundamental repeating unit, such as a dimer, trimer, tetramer, pentamer, hexamer, etc., but not a "monomer" (which may have only one fundamental unit).

"End-capped polymer coating", as used herein, refers to a polymer coating containing polymer chains originating and/or terminated in, or with, a specific chemical moiety. The polymers can be capped to modify the physical and/or chemical properties of the polymer chains. The polymer chains may be linear or branched.

"Insulation" or "Insulating", as used herein, means a material exhibiting a resistivity of $>10^{14}$, $>10^{15}$, or $>10^{16}$ Ohm-cm, with a dielectric breakdown strength of >5,000, >6,000, or >7,000 Volts/mil.

"Low surface energy", as used herein, means a material with a critical surface tension <30, 25, 20, 19, 18, 17, 16, 15, 14, 13, 12, 11, or 10 dyn/cm.

"Hydrophobic", as used herein, means a material with a static contact angle with deionized water in air of >90°, 95°, 100°, 105°, 110°, 115°, or 120°.

"Non-wetting", as used herein, refers to coating having a dynamic contact angle with a liquid of at least 90 degrees. Examples of non-wetting surfaces include, for example, superhydrophobic surfaces, superoleophobic surfaces, and supermetallophobic surfaces.

II. Methods for Preparing Devices Coated with CVD-Applied Coatings

Devices coated with materials deposited using CVD techniques and methods of making and using are described herein.

Suitable CVD techniques include, but are not limited to, chemical vapor deposition (CVD), initiated chemical vapor deposition (iCVD), pyrolytic CVD (PCVD), plasma-enhanced (PECVD), and physical vapor deposition (PVD). Using CVD techniques, the coating can be deposited continuously or semi-continuously on the substrate. The substrate can be individual articles to be coated or can be a continuous substrate, such as a flexible material. The flexible material can be spooled between two rolls. The coating material can be polymeric, such as a homopolymer, copolymer, or terpolymer; metallic materials, such as metals and metal oxides, ceramics, or combinations thereof. The material to be deposited can be applied in multiple layers to prevent coating defects. For those embodiments where the deposited material is polymeric, processing steps can be applied resulting in a higher molecular weight of the vapor deposited polymer.

Organic materials, inorganic materials, and combinations thereof can be deposited. The materials can be polymeric, non-polymeric, or combinations thereof. In one embodiment, the one or more of the coatings deposited on the device or assembly is an amorphous fluoropolymer, such as PTFE. In some embodiments, the amorphous fluoropolymer layer is backfilled with another vapor-deposited polymer, such as siloxanes, acrylates, or parylene-based films.

In still other embodiments, the coating is comprised of multiple layers, not all of which are applied by vapor deposition. In some embodiments, one of the layers is a liquid applied crystal polymer layer and the one or more additional layers are applied by vapor deposition.

In still other embodiments, the surface coating is a hydrophobic surface coating which is a composite of a hydrophobic vapor deposited polymer and a hard filler material such as clay particles or diamond particles.

The coatings described herein should have low surface energy, ideally deposits conformally over complex geometries, and/or have inherent roughness/porosity capable of retaining a layer of liquid at the surface.

A. Initiated Chemical Vapor Deposition (iCVD)

In some embodiments, the coatings are applied using initiated chemical vapor deposition (iCVD). Initiated CVD (iCVD) is a variation of hot filament chemical vapor deposition and is a one-step, solvent-free process. The iCVD mechanism closely resembles free radical polymerization and preserves the important organic functional groups of the monomeric reactant. In iCVD, a gas (e.g., commercially-available hexafluoropropylene oxide) or mixture of gases is introduced into a reactor under mild vacuum in the vicinity of an array of heated filament wires. The gas decomposes into reactive species—radicals—that serve as monomer units. These units then migrate to a cold surface on which they combine and grow into a conformal polymer thin film. The monomer units successively add to one another, forming a linear chain having the precise chemical makeup of the polymer.

The low operating pressures of an iCVD process, typically in the 10-100 Pa (75-750 mTorr) range, allow conformal coating of extremely fine objects such as particles. "Conformal", as used herein, generally means that that the features of the object being coated, such as angles, scale, etc. are preserved. Indeed, uniform "shrink-wrapping" of geometries as small as carbon nanotubes (40 nm PTFE coating) has been demonstrated.

CVD reactants and reactor designs can be chosen such that selective chemical pathways are followed under conditions of low filament temperature and low energy input (5-400 Watts). No electrical excitation of the gas is required, and film growth proceeds via conventional polymerization pathways. iCVD coating thicknesses in the 25 nm to 10 μm range are typical, and deposition rates of up to 100 nm/minute or more are achievable.

In the iCVD process, the substrates being coated typically remain at or near room temperature. In contrast, wet spray-on versions of hydrophobic fluoropolymers, such as DuPont's PTFE-based Teflon® containing pre-polymerized PTFE particles, have to be sintered together at >315° C. before use. Such temperatures are considerably higher than the recommended use temperatures for many substrate materials, such as E-paper substrates. In some embodiments, the substrate to be coated is heated to a temperature above room temperature, such as 35° C., 50° C., 75° C., 100° C., or 150° C. In other embodiments, the substrate is maintained at a temperature less than room temperature, such as 20° C., 15° C., 10° C., 5° C., 0° C., −5° C., −10° C., or −25° C. In still other embodiments, the substrate to be coated is maintain at approximately room temperature, e.g., 20° C. to 35° C., more preferably from about 25° C. to about 30° C.

Wet-applied fluorinated hydrophobic coatings also contain harmful surfactants and are difficult to deposit uniformly. Unlike conventional wet-applied coatings, coatings deposited using iCVD are immediately ready to use after deposition, contain no surfactants, and require no post-processing (i.e., no high temperature drying or annealing). However, post-processing steps to modify surface morphology or surface chemistry can be applied for a particular application.

One advantage of using pyrolytic CVD is the ability to make ultrathin pinhole-free coatings. This has significant advantages in the construction of devices as it reduces the voltage requirements for switching by reducing the coating thickness required for device insulation.

CVD can also be utilized for the deposition of the electrode layer through oxidative CVD of a conjugated monomer for the formation of an intrinsically conducting polymer. In one embodiment, the conjugated polymer to be applied is poly(3,4-ethylenedioxythiophene (PEDOT). This approach could be utilized to construct transparent devices on paper or other highly temperature sensitive substrates when combined with a suitable barrier material. Surface preparation steps prior to coating may be desirable to maximize the interaction of the coating with the electrode material and eliminate defects or coating delamination issues. Other conducting polymers, such as polythiophenes, polypyroles, polyacetylenes, etc, can also be used.

1. Substrates

CVD-deposited polymers are highly conformal to substrates and allow coating of non-planar materials including fibrous and woven substrates. CVD deposition, especially initiated CVD, is extremely gentle on substrates allowing for them to remain at or near room temperature and avoiding damage due to energetic attack on the substrate common to methods such as plasma CVD. This allows for coating of a wide range of materials including, but not limited to, fibrous substrates, such as textiles and papers, plastics, and membranes, along with all metals, metal oxides, ceramics, glasses and other traditional device substrate materials such as silicon. Textiles may include, woven and non-woven materials (e.g., fibers), electrospun materials, paper, silk, and natural and synthetic cloths. Plastics may include, but are not limited to, polydimethylsiloxane (PDMS), polyethylene terephthalate (PET), polyethylene naphthalene (PEN), polystyrene (PS), polycarbonates (PC), polyethylene (PE), polytetrafluoroethylene (PTFE), and others.

The substrate can be treated to vary the properties of the substrate and/or to modulate the interactions between the substrate and the coating. For example, in some embodiments, the substrate is treated prior to coating for the purposes of increasing coating adhesion. In particular embodiments, the surface morphology is affected by roughening, polishing, exposure to electron beam, IR radiation, gamma radiation, plasma exposure, thermal treatment, and/or laser exposure.

CVD also has been shown to allow the deposition of highly flexible coatings. Surface energy may be tailored through composition and morphology as detailed above. This opens up a large range of possible devices for which this technology can be utilized including, but not limited to: displays, lenses, microfluidics, fiber optics, fluidic control systems, printing, optics, fuel cells, analytical systems, micro-reactors, MEMs, micro-pumps, molecular diagnostics, DNA separation and analysis, and polymer electrophoresis. CVD coatings are easily patternable, such as through contact or other physical masking techniques. CVD coatings can be utilized in many manufacturing configurations including both batch and roll-to roll deposition systems.

2. Grafting Sites on the Substrate

Because iCVD is a surface controlled process it affords unprecedented opportunity for producing adherent polymer films, including patterned polymer films. Vinyl groups covalently anchored to a surface can react with the initiating species by the same free radical mechanism responsible for polymerization of vinyl monomers, allowing propagation to proceed from the surface bound radical (e.g., covalently bound polymer chains). These grafting sites improve the adhesion for both the directly bound polymer chains, as well as the subsequently deposited chains which can become entangled in the grafted layer or branch out from the grafted chains. Grafting of iCVD polymers, including fluoropolymers and siloxanes, has been described in the literature. Adhesion promotion of iCVD films has been demonstrated with silane coupling agents such as 3-aminopropyldimethylethoxysilane. Grafting and surface promotion/priming agents include but are not limited to silane coupling agents, including but not limited to trichlorovinylsilane, trichlorophenylsilane, 3-aminopropyldimethylethoxysilane, gamma-methacrylosypropyltrimethoxysilane, and maleic anhydride.

3. Pre- and Post-Processing Steps

Pre- and post-processing steps can be performed in order to maximize barrier coating efficacy.

Pre-processing steps include surface preparation steps including, but not limited to, rinsing the substrate in one or more liquids and/or exposing the substrate to a plasma; pretreatment of the substrate to promote adhesion of the deposited coatings, such as applying or functionalizing the substrate with one or more grafting/priming agents; altering the surface morphology of the substrate; and combinations thereof.

Methods for improving adhesion include but are not limited to treating the substrate with activating plasma to form reactive sites for the grafting of CVD deposited polymer(s) and treating the substrates with a silane or other chemical moiety for the linking of organic and metallic materials. In some embodiments, one or more of the coatings are covalently grafted to the surface of the device or assembly.

Methods for altering the surface morphology of the substrate include, but are not limited to, roughening, polishing, electron bean, IR radiation, gamma radiation, plasma exposure, thermal treatment, or laser exposure.

The substrate can also be treated to alter or modify the surface chemistry. Techniques include, but are not limited to, silane deposition, electron beam, IR radiation, gamma radiation, plasma exposure, thermal treatment, or laser exposure.

Post-processing steps include, but are not limited to, plasma crosslinking of pyrolytic CVD-deposited coatings; post-deposition energetic treatment (annealing, IR, gamma, etc.); post-deposition densification (e.g. radiation hardening; irradiation for cross-linking, "re-reaction"); and combinations thereof. These post processing steps can be used in a similar manner to the pre-processing steps, e.g., modify surface morphology and/or surface chemistry.

For example, the coatings can be modified (e.g., pre- or post-coating) to introduce roughness and/or porosity to the coating. In some embodiments, the coating has a porosity of about 0.5%, 1%, 2%, 3%, 5%, 8%, 10%, 15%, 20%, 25%, 35%, 50%, or greater. In some embodiments, the coating has morphological features have size of about 5 nm, 10 nm, 25 nm, 50 nm, 100 nm, 150 nm, 200 nm, 250 nm, 500 nm, or greater. The coatings can have multiscale roughness, i.e., morphological features of various sizes, which can be random or a graded scale of feature sizes.

In order to maximize ease of deposition and processing, the coating may be formed of graded composition to optimize both bulk and surface properties without the need for multiple coatings. This may be achieved by varying the composition of feed gas to a pyrolytic CVD reactor throughout deposition.

4. Non-Polymeric Materials

A variety of non-polymeric materials can be deposited on the substrate. Exemplary non-polymeric materials include, but are not limited to, rough sputtered metals, ceramics, such as silicon containing inorganics (e.g., $SiO_2$), low surface energy silanes, such as fluorinated silanes, and combinations thereof. One or more of the non-polymeric materials above can be codeposited with one or more of the polymeric materials described below.

Exemplary metals which can be rough sputtered include, but are not limited to, silver, metal oxides, such as zinc oxide, tin oxide, and titanium dioxide, metal nitrides, such as titanium nitride.

Ceramics, alone or in combination with other materials, can be deposited on a substrate. Exemplary ceramics include, but are not limited to, barium titanate (often mixed with strontium titanate), bismuth strontium calcium copper oxide, a high-temperature superconductor, boron nitride, ferrite, lead zirconate titanate (PZT), magnesium diboride ($MgB_2$), porcelain, silicon containing inorganic, such as sialon (Silicon Aluminium Oxynitride), silicon carbide (SiC), silicon nitride ($Si_3N_4$), steatite (magnesium silicates), titanium carbide, uranium oxide ($UO_2$), Yttrium barium copper oxide (YBa2Cu3O7–x), zinc oxide (ZnO), and zirconium dioxide (zirconia).

5. Monomers

The coatings can be formed using a variety of different monomeric species, such as difluorocarbene, ethylenedioxythiophene, trivinyltrimethylcyclotrisiloxane, hydroxyethylmethacrylate, vinylpyrrolidone, functional acrylates and functional methacrylates, such as fluorinated acrylates and/or methacrylates, diacrylates, dimethacrylates, siloxane compounds containing unsaturated organic moieties, and silicone containing polymers.

Other suitable coating materials include graphene, graphite, molybdenum disulfide, tungsten disulfide, electrically conductive coatings, electrically insulating coatings, and hydrophilic coatings. In other embodiments, one or more of the monomers contain one or more pendant reactive groups, such as epoxy groups.

Exemplary monomers are represented by the structures below:

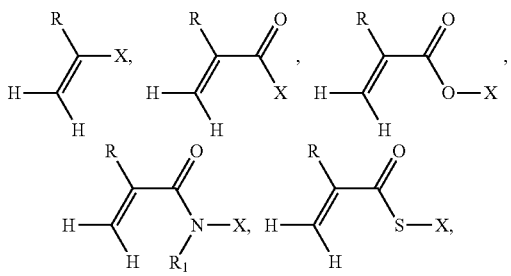

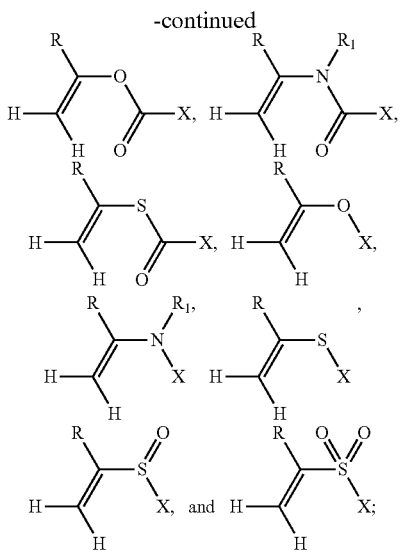

wherein R and $R_1$ are independent selected from hydrogen, alkyl, aralkyl, heteroaralkyl, and carboxyl; halogen (e.g., bromine, chlorine, fluorine, etc.), hydroxyl, alkyoxy, aryloxy, carboxyl, amino, acylamino, amido, carbamoyl, sulfhydryl, sulfonate, and sulfoxido; X is selected from the group consisting of hydrogen, alkyl, cycloalkyl, heteocycloalkyl, aryl, heteroaryl, aralkyl, heteoaralkyl, and —$(CH_2)_n$Y, where Y is selected from the group consisting of hydrogen, alkyl, cycloalkyl, heterocycloalkyl, aryl, heteroaryl, aralkyl, heteoaralkyl, nitro, halo, hydroxyl, alkyoxy, aryloxy, carboxyl, heteroaryloxy, amino, acylamino, amido, carbamoyl, sulfhydryl, sulfonate, and sulfoxido; and n is 1-10 inclusive.

In some embodiments, R is hydrogen or methyl, X is hydrogen or —$(CH_2)_n$Y, where Y is alkyl, cycloalkyl, heterocycloalkyl, aryl, nitro, halo, hydroxyl, alkyloxy, aryloxy, amino, acylamino, amido, or carbamoyl, and n is 3-8 inclusive. In other embodiments, R, X and n are as defined above and Y is hydrogen, heterocycloalkyl, or oxirane.

In other embodiments, the monomer is selected from $C_2F_4$, $C_3F_8$, $CF_3H$, $CF_2H_2$, $CF_2N_2$ (difluordiaxirine), $CF_3COCF_3$, $CF_2ClCOCF_2Cl$, $CF_2ClCOCFCl_2$, $CF_3COOH$, difluorohalomethanes such as $CF_2Br_2$, $CF_2HBr$, $CF_2HCl$, $CF_2Cl_2$, and $CF_2FCl$; difluorocyclopropanes such as $C_3F_6$, $C_3F_4H_2$, $C_3F_2Cl_4$, $C_2F_3Cl_3$, and $C_3F_4Cl_2$; trifluoromethylfluorophosphanes such as $(CF_3)_3PF_3$, $(CF_3)_2PF_3$, and $(CF_3)PF_4$; or trifluoromethylphosphino compounds such as $(CF_3)_3P$, $(CF_3)_2P$—$P(CF_3)_2$$(CF_3)_2PX$, and $CF_3PX_2$, where X is F, Cl, or H. Other monomers can also be employed.

i. Fluorinated Monomers

CVD techniques, such as iCVD, can be used to polymerize fluorinated monomers containing vinyl bonds. Fluoropolymers, if they can be dissolved at all, require the use of harsh solvents for liquid-base film casting process. Vapor-based processes avoid the difficulties resulting from surface tension and nonwetting effects, allowing ultrathin films (<10 nm) to be applied to virtually any substrate. Thus, iCVD is highly suitable for the deposition of fluoropolymers. Suitable fluorinated monomers include, but are not limited to, perfluoroalkylethyl methacrylate ($CH_2$=$C(CH_3)$$COOCH_2CH_2$—$(CF_2)_n$$CF_3$, perfluoroalkyl acrylates ($CH_2$=$CHCOOCH_2CH_2(CF_2)_2$—$CF_3$), perfluoroalkenes ($CF_2$=$CF$—$(CF_2)_n$—$CF_3$) where n=5-13, and fluorinated propylene oxides, such as hexafluoropropylene oxide (HFPO).

In addition to homopolymers, iCVD copolymers of one or more fluorinated monomers with other monovinyl, divinyl, trivinyl, and cyclic monomers can be used to tune surface energy, surface roughness, degree of crystallinity, thermal stability, and mechanical properties. Control over surface properties is critical for electrowetting applications, since the surface energy and roughness directly determine the contact angles achieved with liquids and hysteresis between the advancing and receding angles. By reducing crystallinity, copolymerization reduces the probability the formation of pinholes resulting from the incomplete surface coverage that occurs when two or more crystallite domains meet. Thermal, e-beam, or UV post-treatments can alter the surface properties of the iCVD layer, leading to changes in the observed contact angles and hysteresis behavior.

ii. Polysiloxane Coatings

CVD techniques, such as iCVD, can also be used to prepare polysiloxane ("silicone") coatings formed from siloxane-containing monomers including, but not limited to, vinyl siloxane monomers, such as trivinyl-trimethyl-cyclotrisiloxane (V3D3) The resulting material [poly(V3D3)] is a highly cross-linked matrix of silicone and hydrocarbon chemistries. The dense networked structure renders this material more resistant to swelling and dissolution compared with coatings having little or no crosslinking, such as conventional silicones or parylene.

In some embodiments, the polymer contains both fluorine and siloxane moieties. For example, in particular embodiments, the coating contains a polymer containing siloxane moieties terminated by fluorine containing groups. In one embodiment, the siloxane containing polymer is poly(trivinyl-trimethyl-cyclotrisiloxane) and the fluorine containing termination groups are composed of fragments of perfluorobutane sulfonate.

6. Initiators

In certain embodiments, when a gaseous initiator is utilized, the gaseous initiator is selected from the group consisting of compounds of Formula I:

A-X—B    (Formula I)

wherein, independently for each occurrence, A is hydrogen, alkyl, cycloalkyl, aryl, heteroaryl, aralkyl or heteroaralkyl; X is —O—O— or —N=N—; and B is hydrogen, alkyl, cycloalkyl, aryl, heteroaryl, aralkyl or heteroaralkyl.

In certain embodiments, the gaseous initiator is a compound of formula I, wherein A is alkyl.

In certain embodiments, the gaseous initiator is a compound of formula I, wherein A is hydrogen.

In certain embodiments, the gaseous initiator is a compound of formula I, wherein B is alkyl.

In certain embodiments, the gaseous initiator is a compound of formula I, wherein X is —O—O—.

In certain embodiments, the gaseous initiator is a compound of formula I, wherein X is —N=N—.

In certain embodiments, the gaseous initiator is a compound of formula I, wherein A is —$C(CH_3)_3$; and B is —$C(CH_3)_3$. In certain embodiments, the gaseous initiator of the invention is a compound of formula I, wherein A is —$C(CH_3)_3$; X is —O—O—; and B is —$C(CH_3)_3$.

In certain embodiments, the gaseous initiator is selected from the group consisting of hydrogen peroxide, alkyl or aryl peroxides (e.g., tert-butyl peroxide), hydroperoxides, halogens and nonoxidizing initiators, such as azo compounds (e.g., bis(1,1-dimethyl)diazene).

Note that "gaseous" initiator encompasses initiators which may be liquids or solids at standard temperature and pressure (STP), but upon heating may be vaporized and fed into the chemical vapor deposition reactor.

7. End-Capped Polymers

For some applications, it may be desirable to form polymer coatings in order to reduce the likelihood that the polymer reacts with moisture in the surrounding environment. Conventional HFCVD methods of forming polymer coatings do not include a polymer chain termination step. As a result, reactive groups are retained at the end of each polymer chain. On exposure to the atmosphere, such groups can react with ambient oxygen and/or moisture, forming polar end groups (e.g., carboxylic acids, sulfonic acids, hydroxyl groups, amines, etc.) on the polymer chains, reducing the lubricity of the coating. Polar end groups may also increase the surface energy of the coating and compromise other desirable properties such as hydrophobicity.

To prevent the formation of polar end groups, a method of forming an end-capped polymer coating on an article is disclosed including the steps of (1) evacuating a vacuum chamber, (2) introducing a precursor gas and a fluorocarbon gas into the vacuum chamber, (4) directing the precursor gas and the fluorocarbon gas into the vicinity of one or more heated filaments, thereby activating the one or more gases, and (5) forming an end-capped polymer coating on the article.

In a related embodiment, to prevent the formation of polar end groups, a method of forming an end-capped polymer coating on an article is disclosed including the steps of (1) evacuating a vacuum chamber, (2) introducing a precursor gas into the vacuum chamber, at or below atmospheric pressure (3) directing the precursor gas into the vicinity of an energy source, thereby activating the precursor gas, (4) forming a polymer coating on the article, (5) ceasing flow of the precursor gas and commencing flow of a fluorocarbon gas and, (6) directing the fluorocarbon gas into the vicinity of an energy source, thereby activating the fluorocarbon gas, and (7) terminating the polymer chains of the coating with activated fragments of the fluorocarbon gas.

The sequential method described above permits the use of a variety of energy sources to activate the gases, including, but not limited to, one or more heated filaments, ionic plasma, pulsed plasma, UV irradiation, or gamma irradiation.

The backbone of the polymer chains in the polymer coating is formed from the precursor gas. The precursor gas may be, for example, hexafluoropropylene oxide (HFPO). The polymer chains thus formed may be terminated ("end-capped") by a fluorocarbon gas. The fluorocarbon gas may be, for example, hexafluoroethane. In this case, homolysis of hexafluoroethane produces trifluoromethyl radicals, which react with the reactive ends of the PTFE chains formed from HFPO, yielding PTFE terminated by non-polar trifluoromethyl groups.

The degree of end-capping can be controlled by varying the amount of gas introduced into the chamber. In one embodiment, the percent of end groups that are end-capped is at least 5%, 10%, 15%, 20%, 25%, 30%, 35%, 40%, 45%, 50%, 55%, 60%, 65%, 70%, 75%, 80%, 85%, 90%, or 95%. In a particular embodiment, the percent of end groups that are end-capped is greater than 40% preferably greater than 50%, more preferably greater than 70%.

In some embodiments, device or assembly contains a final surface layer of a hydrophobic polymer coating which is end-capped with a highly hydrophobic molecule containing at least one $CF_3$ moiety in order to decrease the surface energy of the surface.

In still other embodiments, the hydrophobic polymer layer is end-capped throughout its deposition, not only at the surface.

8. Porosity

In some embodiments, the polymer coating contains nano- or microporosity. The size and density of this porosity may be varied through control of the pyrolytic CVD conditions (such as pressure, filament temperature, substrate temperature, monomer to initiator ratio, and residence time). Porosity is also controlled through selection of monomer or monomers and optionally free radical initiator. Porous vapor deposited coatings may be deposited as thin as a few nanometers and up to 10s of microns thick. The pores may be the same size or different sizes.

The pores can be backfilled or impregnated with one or more materials to modify the properties of the coatings. In one embodiment, the pores are back filed with one or more additional vapor deposited polymers and can be deposited using techniques known in the art, such as those discussed above. In one embodiment the porous polymer would be PTFE and the backfilling polymer is a parylene derivative or siloxane containing polymer.

i. Liquid Impregnation

In another embodiment, the pores of the nano/microstructured vapor deposited polymer coating are impregnated with a lubricating oil to generate low contact angle hysteresis. Contact Angle Hysteresis is defined as the difference between advancing and receding contact angles. This hysteresis occurs due to the wide range of "metastable" states which can be observed as the liquid meniscus scans the surface of a solid at the solid/liquid/vapor interface.

The liquid can be impregnated using techniques known in the art. For example, deposited films can be placed on a spin coated and a measure volume of the liquid to be impregnated dispensed into the center of the sample. The sample is spun at a set speed for a suitable amount of time (e.g., 500 RPM for 15 seconds followed by 3500 RPM for 4 minutes). The sample is heated until the water contact angle hysteresis reached a predetermined value, e.g., 7 degrees.

Alternative, the deposited film sample can be immersed in the liquid to be impregnated as a temperature from about 25° C. to about 100° C., for example, 25° C., 40° C., 50° C., 60° C., 70° C., 80° C., 90° C., or 100° C. for a period of time from about 30 seconds to about 5 minutes, such as 30 sec, 1 minute, 2 minutes, 3 minutes, 4 minutes, or 5 minutes. The impregnated sample can be sonicated in an aqueous surfactant solution and the WCA hysteresis assessed at a predetermined time interval, e.g., every 3 minutes.

In some embodiments, the coating exhibits a contact angle hysteresis value less than 20°, 15°, 10°, 7°, 5°, 4°, 3°, or 2°. In some embodiments, the impregnated film exhibits no change in surface properties even after 10, 20, 30, 40, 50, 60, 70, 80, 90, 100, 110, 120 minutes or greater of sonication in a 1% surfactant solution (e.g., dawn liquid, branson cleaner).

In some embodiments, the liquid has a viscosity at 25° C. of less than 1000, 750, 500, 400, 300, 200, 100, 75, 50, or 25 cps. In other embodiments, the liquid has the viscosity defined above and a vapor pressure less than 25, 20, 15, 12, 10, 8, 5, 4, 3, 1, 0.1, 0.01, or 0.001 mm Hg. In some embodiments, the lubricating fluid remains a liquid at low temperatures, e.g., has a freezing point less than −5, −10, −15, −20, −25, −30, −35, −40, −45, −50, −55, −60, −65, −70, or −75° C.

Examples of lubricating liquids include any type of liquid that is capable of providing the desired non-wetting properties. For example, the may be oil-based or water-based (i.e., aqueous). In certain embodiments, the liquid is an ionic liquid (e.g., BMI-IM). Other examples of possible liquids include hexadecane, vacuum pump oils (e.g., FOMBLIN® 06/6, KRYTOX® 1506) silicon oils (e.g., 10 cSt or 1000 cSt), fluorocarbons (e.g., perfluoro-tripentylamine, FC-70), shear-thinning fluids, shear-thickening fluids, liquid polymers, dissolved polymers, viscoelastic fluids, and/or liquid fluoroPOSS. In certain embodiments, the impregnating liquid is (or comprises) a liquid metal, a dielectric fluid, a ferro fluid, a magneto-rheological (MR) fluid, an electro-rheological (ER) fluid, an ionic fluid, a hydrocarbon liquid, and/or a fluorocarbon liquid.

For example, a porous 50 nm iCVD PTFE coating, impregnated with a low surface tension oil (e.g., Krytox oil), resulted in water contact angle hysteresis values as low as 2°. This can be useful in a variety of applications where thin coatings exhibiting both hydrophobicity and low contact angle hysteresis are important in achieving maximum droplet modulation or motion.

Oil may be infused in the coating through dip, spray, or spin-on methodologies. The application of heat may also be helpful in infusing the oil into the pores of the coating. Excess oil may be removed by evaporation (heating on a hot plate), dripping off excess oil (gravity), washing with surfactant. Non-wetting surfaces can provide self-cleaning properties, withstanding high drop impact pressures, self-heal by capillary wicking upon damage, repel a variety of liquids, reduce ice accretion, and enhance condensation.

Once infused, the oil/coating combination may be extremely stable, even in the presence of surfactants or other oils. For example, the 50 nm iCVP PTFE film infused with Krytox oil, discussed above, exhibited no change in surface properties even after 60 minutes of sonication in a 1% surfactant solution (dawn liquid, branson cleaner).

9. Additional Barrier Materials

Additional barrier materials can be used in combination with the iCVD deposited coatings. Exemplary additional barrier materials which may be utilized in combination with pyrolytic CVD coatings, or copolymerized with them include, but are not limited to, COC (cyclic olefin copolymer); polypropylene; polyurethane; PVC; PET; epoxy; polycarbonate; and combinations thereof.

III. Devices

Devices which have been coated with one or more vapor-deposited materials are described herein. The device can be coated using one or more of the techniques discussed above.

The presence of the lubricating oil drastically reduces pinning of condensate. The lubricant can cloak the condensate and inhibit its growth. Condensate droplets become highly mobile and move continuously. This mobility produces a continuous sweeping effect that clears the surface for fresh nucleation and results in enhanced condensation. The coatings can also reducing ice formation and attachment.

Suitable properties include, but are not limited to, enhanced liquid condensation, resistance to ice formation (e.g., power lines, aircraft components, boat and ship components, structural cables, etc.), resistance to fogging (e.g., facemasks, goggle, faceshields, etc.), reduced drag in liquids, resistance to gas hydrate adhesion, provide antifouling properties, inhibition of corrosion, provide semi-permanent lubrication, present self-cleaning properties, or prevent microbial colonization.

Such surfaces would be beneficial to a wide variety of applications. For example, repellency to liquids ranging from water, acids and bases, oil, blood, fuel, would be benefit areas ranging from architecture and biomedical devices to transportation. Surfaces offering enhanced condensation would be useful in industrial processes such as power generation, desalination, water harvesting, air conditioning, thermal management, and transportation. Ice-phobic coatings would present economic and safety benefits for many infrastructures such as power lines, aircraft, wind turbines, marine vessels, and telecommunications equipment, as well as in commercial refrigerators and freezers. Semi-permanent lubrication could be used in devices from machine parts and engines to medical device assemblies.

In one embodiment, the device is not an electrowetting or electrofluidic device or assembly, that is, the device is other than an electrowetting or electrofluidic device or assembly.

In some embodiments, the coating is well adhered to the substrate as defined by ASTM D3359.

In some embodiments, the advancing and receding contact angles of the coated devices vary by no more than 30°, 20°, 10°, or 5° with respect to water. In some embodiments, the advancing and receding contact angles of the coated devices vary by no more than 30°, 20°, 10°, or 5° with respect to hexadecane.

In some embodiments, an electrical bias of no greater than 25V, 20V, or 15V is required to impart a reduction of >100°, >80°, >60° in the static contact angle of water on the coating.

In some embodiments, the static contact angle with respect to water is varied by varying the surface morphology of the coating. The variation in surface morphology can be imparted through variation of coating deposition process conditions, such as vapor residence time, reactor temperature, reactor pressure, substrate temperature, filament temperature, filament composition, monomer concentration, inert gas concentration, substrate position within the reactor, comonomer concentration, and combinations thereof. In other embodiments, the surface morphology is altered through processing of the coating subsequent to deposition, such as by UV, thermal, corona discharge, e-beam, gamma radiation, ionic plasma, IR radiation, and mechanical patterning or abrasion.

CVD can be used to apply thin, uniform coatings to a variety of substrates. Typical thicknesses are less than 1000 nm, 750 nm, 500 nm, 250 nm, 100 nm, 50 nm, 25 nm, 10 nm, or 5 nm. In some embodiments, the device or assembly is coated conformally with less than 50%, 40%, 30%, 20%, 10%, 5%, or 1% variation in coating thickness over microfeatures on the device or assembly surface. In other embodiments, the coating forms a conformal and substantially pin-hole free layer at a thickness of about 500 nm, 250 nm, 100 nm, 50 nm, 25 nm, 10 nm, or 5 nm.

The coated devices described herein can exhibit one or more of the properties discussed above.

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention described herein. Such equivalents are intended to be encompassed by the following claims.

EXAMPLES

Example 1. Infusion of Vapor Deposited, Porous Fluoropolymer Film with Fluorinated Oil Deposited fluoropolymer films were placed on a spin coater and a measured volume of Krytox 1506 dispensed into the center of the sample. The sample was spun at 500 rpm for 15 seconds followed by 3500 rpm for 4 minutes. The sample was removed from the spin coater and placed on a heated plate at 100° C. The water contact angle (WCA) hysteresis of the sample was assessed every 5 minutes, with heating concluded once the WCA reached 7 degrees.

Alternately, the oil was dispersed into the coating by immersing the entire sample at a temperature of from about 25° C. to about 100° C. for a period from about 30 seconds to about 5 minutes. The sample was sonicated in an aqueous surfactant solution and assessed as above after every 3 minutes of sonication.

Example 2. Stability of Fluid-Impregnated Coatings

A 50 nm iCVP PTFE film was impregnated with a low surface tension oil (e.g., Krytox oil). The resulting film exhibited water contact angle hysteresis values as low as 2°. This can be useful in a variety of applications where thin coatings exhibiting both hydrophobicity and low contact angle hysteresis are important in achieving maximum droplet modulation or motion. The impregnated film exhibited no change in surface properties even after 60 minutes of sonication in a 1% surfactant solution (e.g., dawn liquid, branson cleaner).

We claim:

1. A method for coating a device or assembly substrate with one or more coatings, the method comprising
    directing one or more gaseous precursors into a chamber under vacuum containing the device or assembly substrate to be coated and activating the one or more gaseous precursors with an energy source to coat the device or assembly substrate,
    wherein at least one of the one or more coatings is a porous coating and conforms to the device or assembly substrate, and
    applying one or more lubricating liquids over the entire surface of the porous coating to impregnate the porous coating with the one or more lubricating liquids to generate low contact angle hysteresis,
    wherein at least one of the one or more coatings provides insulation, low surface energy, or both.
2. The method of claim 1, wherein the one or more gaseous precursors comprise reactive monomers.
3. The method of claim 2, wherein the gaseous precursor is a fluorinated unsaturated compound.
4. The method of claim 3, wherein the fluorinated unsaturated compound is selected from the group consisting of fluorinated acrylate, fluorinated methacrylate, fluorinated methyl methacrylate, fluorinate alkenes, fluorinated perfluoroalkylethyl methacrylate, fluorinated alkylethylacrylate, fluorinated propylene oxide, and combinations thereof.
5. The method of claim 2, wherein the monomer is a vinyl siloxane containing monomer.
6. The method of claim 2, wherein the monomer contains a pendant epoxy group.
7. The method of claim 1, wherein the one or more coatings is deposited continuously or semi-continuously on the device or assembly substrate.
8. The method of claim 7, wherein the assembly substrate is a flexible substrate spooled between two rolls.
9. The method of claim 1, wherein the one or more coatings are formed by initiated chemical vapor deposition (iCVD).
10. The method of claim 1, wherein the chemical composition of the one or more coatings is varied over its thickness.
11. The method of claim 1, wherein the device or assembly substrate is treated prior to coating application, wherein the treatment is selected from the group consisting of roughening, polishing, electron beam, IR radiation, gamma radiation, plasma exposure, thermal treatment, and laser exposure.
12. The method of claim 1, wherein the device or assembly substrate is treated prior to coating application,
    wherein the treatment is selected from the group consisting of silane deposition, electron beam, IR radiation, gamma radiation, plasma exposure, thermal treatment, and laser exposure.
13. The method of claim 1, wherein the one or more coatings comprise one or more layers of vapor deposited material.
14. The method of claim 13, wherein at least one of the one or more layers is an amorphous fluoropolymer.
15. The method of claim 14, wherein at least one of the one or more layers comprises a porous polytetrafluoroethylene (PTFE) layer which has been backfilled by another vapor deposited polymer, wherein the backfill polymer is selected from the group consisting of initiated chemical vapor deposition (iCVD) deposited siloxanes, acrylates, and a parylene based film.
16. The method of claim 1, wherein at least one of the one or more coatings comprises multiple layers, one of which is a liquid applied liquid crystal polymer layer and the other layers of which are vapor deposited materials.
17. The method of claim 1, wherein the device or assembly substrate comprises a final surface layer of a hydrophobic polymer coating which is end-capped with a hydrophobic molecule containing at least one $CF_3$ moiety.
18. The method of claim 1, further comprising covalently grafting at least one of the one or more coatings to the device or assembly substrate.
19. The method of claim 1 wherein one or more of the coating layers are deposited by plasma CVD.
20. The method of claim 1 wherein the one or more coatings is deposited in multiple layers.
21. The method of claim 1, wherein the device or assembly substrate is held above room temperature during deposition or below room temperature during deposition.
22. The method of claim 1, wherein the one or more coatings are patterned through contact or physical masking.
23. The method of claim 1, further comprising after coating application, treating the device or assembly substrate with a treatment selected from the group consisting of electron beam, IR radiation, gamma radiation, plasma exposure, thermal treatment, and laser exposure.
24. The method of claim 1, further comprising after coating application, treating the device or assembly substrate with a treatment selected from the group consisting of silane deposition, roughening, and polishing.
25. The method of claim 1, wherein the one or more lubricating liquids is applied to the porous coating via dipping, spraying, or spin coating.

26. The method of claim 25, wherein the one or more lubricating liquids is selected from the group consisting of ionic liquids, hydrocarbons, vacuum pump oils, silicon oils, fluorocarbons, shear-thinning fluids, shear-thickening fluids, liquid polymers, dissolved polymers, viscoelastic fluids, liquid fluoroPOSS, liquid metals, dielectric fluids, ferro fluids, magneto-rheological (MR) fluids, and electro-rheological (ER) fluids.

27. A coated device or assembly substrate, wherein the device or assembly substrate is coated using the method of claim 1.

28. The method of claim 1, wherein the porous coating is a nanoporous coating.

29. The method of claim 1, wherein the porous coating is a microporous coating.

30. The method of claim 1, wherein the porous coating has a porosity of about 0.5%, 1%, 2%, 3%, 5%, 8%, 10%, 15%, 20%, 25%, 35%, or 50%.

31. The method of claim 1, wherein the step of applying the one or more lubricating liquids is carried out at a temperature from about 25° C. to about 100° C.

32. The method of claim 1, wherein the step of applying the one or more lubricating liquids is carried out for a period of time from about 30 seconds to about 5 minutes.

33. The method of claim 1, further comprising cleaning the impregnated porous coating in a surfactant solution following the step of applying the one or more lubricating liquids.

\* \* \* \* \*